United States Patent
Balasubramanian et al.

(10) Patent No.: US 6,468,853 B1
(45) Date of Patent: Oct. 22, 2002

(54) METHOD OF FABRICATING A SHALLOW TRENCH ISOLATION STRUCTURE WITH REDUCED LOCAL OXIDE RECESS NEAR CORNER

(75) Inventors: Palanivel Balasubramanian; Yelehanka Ramachandramurthy Pradeep; Chivkula Subrahmanyam; Narayanan Balasubramanian, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/641,389

(22) Filed: Aug. 18, 2000

(51) Int. Cl.[7] .......................................... H01L 21/8238
(52) U.S. Cl. ...................................... 438/221; 438/424
(58) Field of Search ................................. 438/197, 221, 438/299, 424, 435, 437, 589, 700, 359, 426, 453, 701, 702

(56) References Cited

U.S. PATENT DOCUMENTS

| | | | |
|---|---|---|---|
| 5,940,717 A | | 8/1999 | Rengarajan et al. ........ 438/435 |
| 5,960,298 A | | 9/1999 | Kim ........................... 438/424 |
| 5,989,978 A | | 11/1999 | Peidous ...................... 438/436 |
| 6,001,706 A | | 12/1999 | Tan et al. ................... 438/424 |
| 6,022,796 A | * | 2/2000 | Berry et al. ................ 438/589 |
| 6,040,231 A | * | 3/2000 | Wu ............................. 438/424 |
| 6,054,343 A | * | 4/2000 | Ashburn ...................... 438/221 |
| 6,194,285 B1 | * | 2/2001 | Lin et al. .................... 438/424 |
| 6,261,921 B1 | * | 7/2001 | Yen et al. .................... 438/424 |

* cited by examiner

Primary Examiner—David Nelms
Assistant Examiner—Phuc T. Dang
(74) Attorney, Agent, or Firm—George O. Saile; Rosemary L.S. Pike

(57) ABSTRACT

A structure and a process for manufacturing semiconductor devices with improved oxide coverage on the corners of a shallow trench isolation structure is described. The STI trench is etched using a pad oxide and silicon nitride layers as patterning elements. After trench etch, a thin conformal layer of either amorphous, epitaxial or polysilicon is deposited over the silicon nitride and within the trench and annealed. Where the silicon has been deposited on the silicon bottom and sides of the open trench, the annealing effectively forms a single crystal or epitaxial silicon. Next a silicon oxide liner is grown over the conformal silicon layer. The trench is then filled with silicon oxide, the structure is planarized by either chemical mechanical polishing or etching, and the nitride and pad oxide is removed This leaves a polysilicon film on the vertical edges of the filler oxide which extends slightly above the surface of the silicon substrate. A thermal oxidation step is performed converting the poly film into silicon oxide which slightly extends the STI field oxide into the active device region eliminating any reduced oxide coverage or oxide recesses in the corner regions.

46 Claims, 4 Drawing Sheets

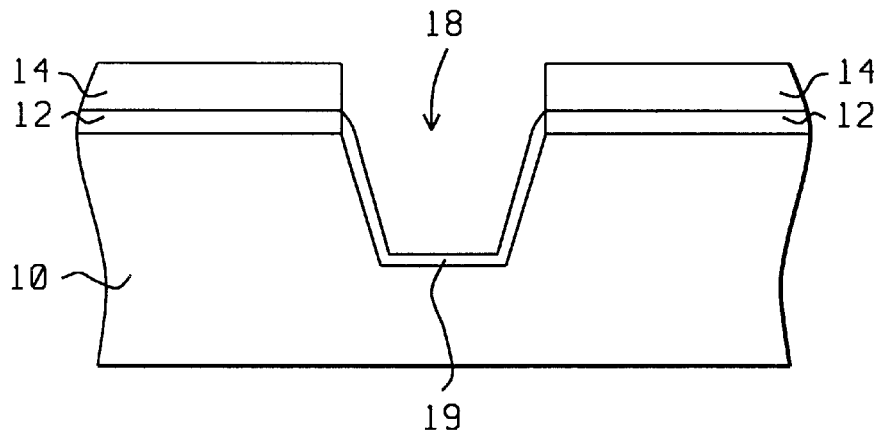
FIG. 1A – Prior Art
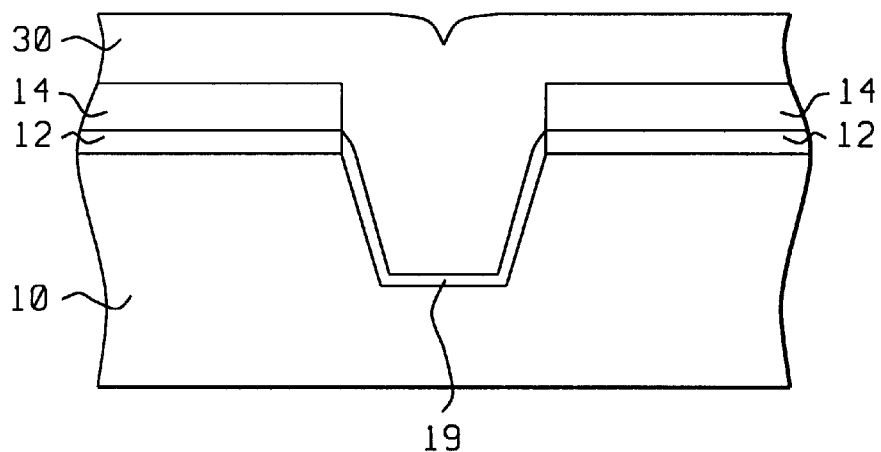
FIG. 1B – Prior Art
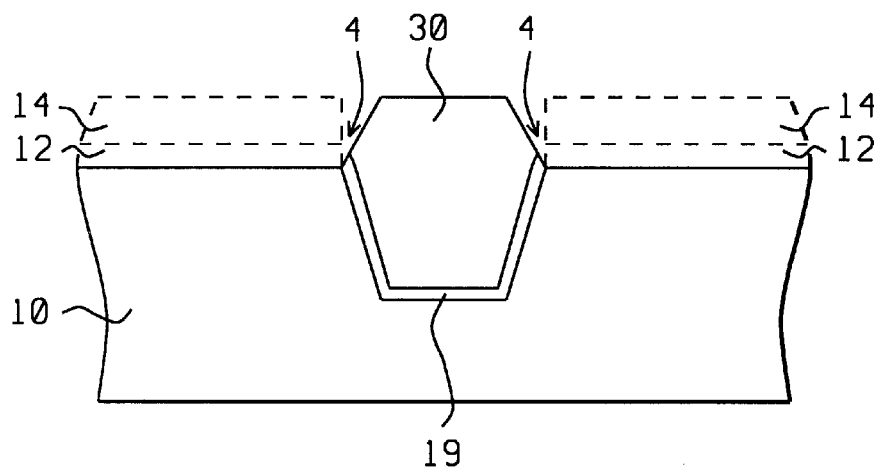
FIG. 1C – Prior Art

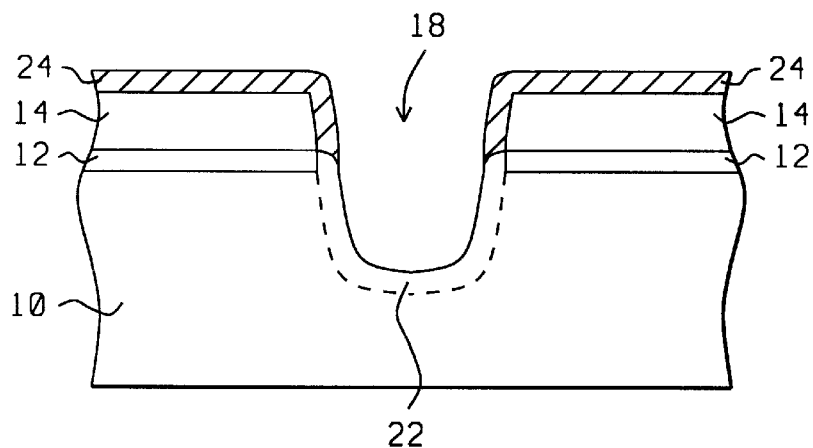
FIG. 5  [ANNEAL]
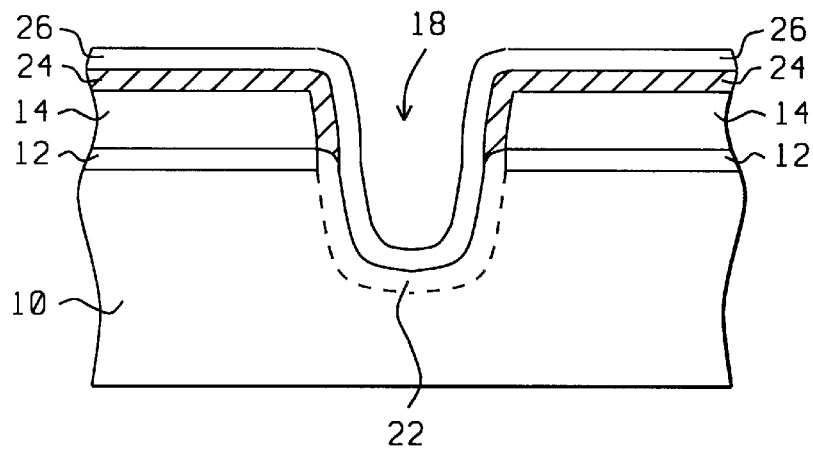
FIG. 6
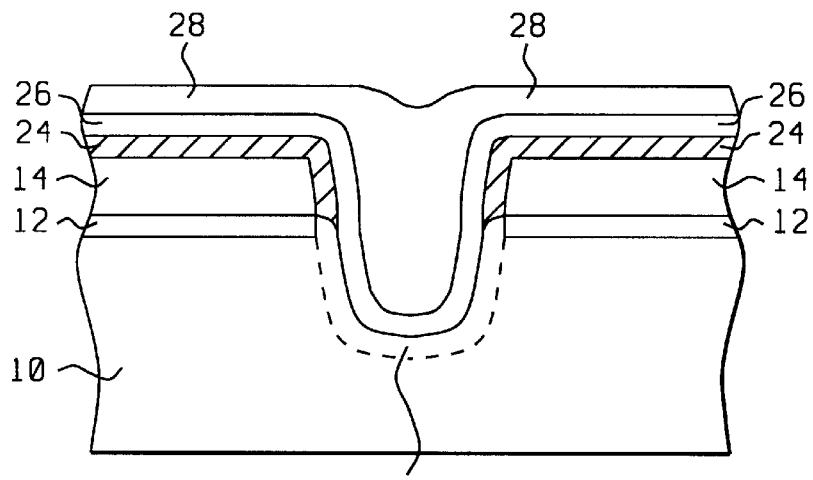
FIG. 7

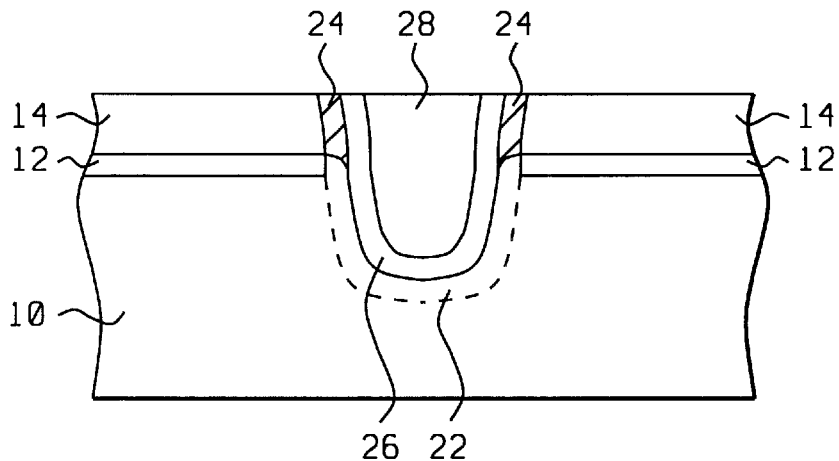
FIG. 8 PLANARIZATION
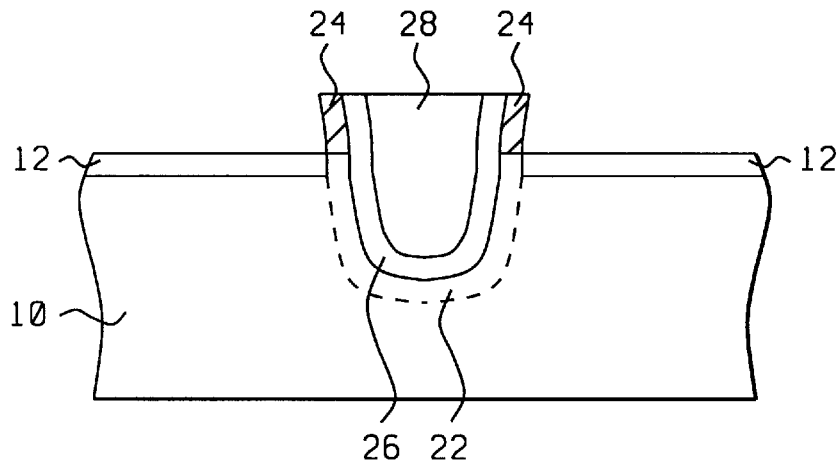
FIG. 9
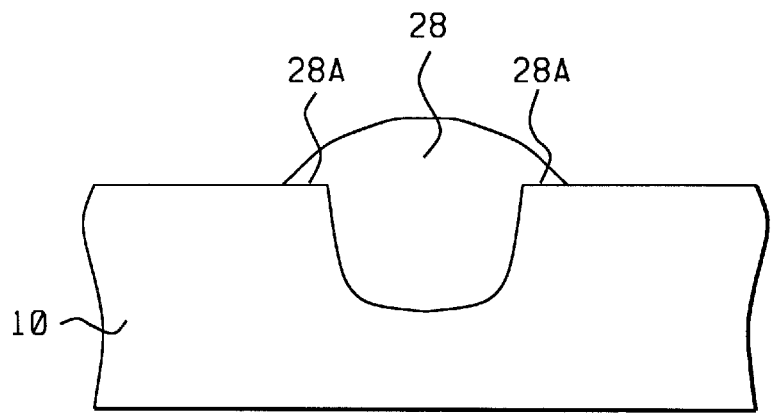
FIG. 10

METHOD OF FABRICATING A SHALLOW TRENCH ISOLATION STRUCTURE WITH REDUCED LOCAL OXIDE RECESS NEAR CORNER

BACKGROUND OF THE INVENTION (1) Field of the Invention

The present invention relates generally to the structure and manufacturing process of a semiconductor device isolation structure for electronic circuit devices and more particularly to a shallow trench isolation (STI) structure with improved field oxide coverage in the top corners near active device areas.

(2) Description of Prior Art

Various field oxide (FOX) isolations are used to electrically isolate semiconductor devices such as field effect transistors (FETs) formed on semiconductor substrates to form integrated circuits. This FOX is formed on single crystalline silicon (Si) for Large Scale Integration (LSI) and Ultra Large Scale Integration (ULSI) circuit applications. One common method of forming the field oxide is by the local oxidation of silicon (LOCOS) method. This method uses a patterned silicon nitride ($Si_3N_4$ or SiN) together with a thin layer of pad oxide ($SiO_2$) for stress relief and the silicon substrate is selectively oxidized to form the semiconductor isolation. This method requires long oxidation times (excessive thermal budgets), and the lateral oxidation under the barrier mask limits the minimum spacing between adjacent active device areas and therefore can become a limiting factor in increasing device packaging density.

A more advanced isolation scheme is to etch shallow trenches in the silicon substrate which are then filled with a chemical vapor deposited (CVD) silicon oxide ($SiO_2$), or some other dielectric. These trenches are typically on the order of 0.25 to 0.35 microns (um) in depth and 0.15 to 0.5 um in width. After the shallow trench isolation (STI) structure is filled with the dielectric, an etchback or chemical mechanical planarization (CMP) step is typically performed. Processing continues with either a capping process or with FET device processing.

However, a typical problem with the conventional prior art STI methods is the reduction or lack of insulator coverage on and around the upper corners of the trench structure. FIG. 1 shows a prior art STI structure. As indicated in FIG. 1A, the structure was formed by the process which started with the substrate 10 upon which a stress relief pad oxide (SiO2) layer 12 has been thermally grown, and then a layer of silicon nitride (SiN) 14, has been deposited using CVD process well understood in the industry. Conventional photolithographic techniques have been used to pattern the SiN 14 and pad oxide 12 to enable a trench 18 to be etched in the substrate 10. The etching process is typically a dry anisotropic process. After etching, the photoresist used for patterning is removed and a thermal oxide layer 19 is grown within the trench as a liner to maintain trench geometry and prevent structure damage during further processing. A low pressure CVD (LPCVD), a sub-atmosphere CVD (SACVD), or high density plasma silicon oxide (SiO2) 30 is then deposited to fill the trench 18 as shown in FIG. 11B. The trench fill CVD silicon oxide is etched back or chemical mechanical polished (CMP) back to the silicon nitride layer 14. This planarization step is typically not very selective and is difficult to control within the required processing tolerances. The SiN 14 layer is next selectively removed using a hot phosphoric acid ($H_3Po_4$) etch typically in the 150 to 180 degrees centigrade (°C.) range, and the pad oxide is removed using dilute hydrofluoric (HF) acid. Frequently, due to etch rates and edge coverage thickness and other process parameters, the field oxide coverage at the upper edge of the STI corners approaching the active device areas can have thin coverage or void 4 as indicated in FIG 1C. This void can cause device operating problems such as current crowding and edge wrap around effects, result in poor gate oxide insulating properties and pose potential reliability exposures.

U.S. Pat. No. 6,001,706 issued to Tan et al., shows a STI process with a doped polysilicon hard mask and an oxide liner.

U.S. Pat. No. 5,960,298 issued to Kim shows an oxide STI trench liner

U.S. Pat. No. 5,940,717 issued to Renegarajan et al. teaches a SiN trench liner.

U.S. Pat. No. 5,989,978 issued to Peidoous teaches a STI process with a liner and barrier layers.

SUMMARY OF THE INVENTION

Accordingly, it is the primary objective of the invention to provide an effective and manufacturable method and structure for an improved shallow trench isolation (STI) element on silicon substrates having improved quality and coverage of the insulating oxide on the structure corners near the active device areas.

It is a further objective of the invention to improve device isolation and operational characteristics by increasing the oxide coverage at the STI corners near the active device areas.

In addition, it is an objective of this invention to provide a polysilicon layer over the device areas that is laterally oxidized to provide a portion of the field oxide extending over the device area thereby minimizing or eliminating the corner oxide voids and consequent detrimental wrap-around effect.

It is yet another object of the invention to provide a method for forming an STI isolation structure with reduced mechanical stress, and improved gate oxide integrity, The above objectives are achieved in accordance with the methods of the invention that describes a structure and a process for manufacturing semiconductor devices with improved STI corner coverage in the active device regions. Beginning with a semiconductor substrate of single crystal silicon, either N or P doped, a first thermal oxide layer is grown thereon to provide a stress release pad oxide. A silicon nitride (SiN) is deposited on the pad oxide layer by LPCVD to be used as a hard mask to pattern the STI element in conjunction with conventional photolithographic methods. An anisotropic plasma etch is used to etch the SiN layer, the pad oxide layer, and to partially etch into the silicon substrate to form trenches where the isolation structures are required.

Now, by the method of the invention, a conformal silicon layer is deposited onto the open trench and on the SiN pad and pad oxide layers where exposed. The deposited silicon can be either amorphous, epitaxial or polysilicon. Typically after depositing the silicon layer an implant is done using silicon as the specie at an energy of between 30 and 50 KeV. The silicon layer is then annealed to form epitaxial silicon where the layer was in contact with the silicon substrate and polysilicon elsewhere. Next, a thermal oxidation is carried out to form a liner oxide layer over the conformal silicon layer. There follows a conformal CVD silicon oxide deposition to fill the trenches and form a trench or gap fill oxide. The CVD oxide is preferably deposited using a low pressure CVD (LPCVD), a sub-atmosphere CVD (SACVD), or a high-density plasma CVD (HDP-CVD). A gap oxide densification step can optionally follow.

The gap fill oxide is then polished back to the nitride layer, and the SiN is selectively removed using a hot phosphoric acid ($H_3PO_4$) etch. This leaves a layer of polysilicon (poly) adhering to the vertical sides of the gap fill oxide slightly over the active device area where the SiN layer was removed. The pad oxide can now be removed using a dilute hydrofluoric (HF) acid, after which a final thermal oxidation is done converting the vertical poly layer into a thermal oxide. It should be noted that the oxide from this poly layer oxidizes 2 to 3 times faster than the oxide formed from the silicon substrate, assuring that the oxide extends over the edge of the device areas. Since this oxide layer is not suitable for the gate oxide layer, it is removed, typically with dilute HF. It is important to note that since the thermal oxide formed from the poly layer etches at a slower rate than the other oxide, an appropriate portion of the field oxide over the edge of the device area remains after etching to prevent unwanted voids or detrimental wrap around corned effects.

An alternative process would be to perform the last STI oxidation step with the pad oxide in place, then remove the pad oxide at the same time as the removal of the final STI oxide from the active device area. Again, because of the slower etch rate of the thermal oxide crated from the poly layer, there will still remain a portion of the field oxide over the active device areas to provide the structure quality and performance enhancements mentioned above.

BRIEF DESCRIPTION OF THE DRAWINGS

FIGS. 1A through 1C are cross section views of a prior art STI device during processing showing a void in the top corner near the active device region.

FIG. 2 through FIG. 8 show cross section views of a shallow trench isolation device illustrating the process used to create the STI structure of the invention.

FIG. 9 is a cross section view of a semiconductor device showing a key embodiment of the invention, the STI trench fill oxide extending slightly above the substrate surface with a thin polysilicon layer on the vertical sides of the filler plug above the surface of the substrate.

FIG. 10 is an illustration of a key embodiment of the invention showing the STI field oxide filler with a slight overlap into the active device area at the STI corners assuring good coverage.

DESCRIPTION OF THE PREFERRED EMBODIMENTS

Figure 2:
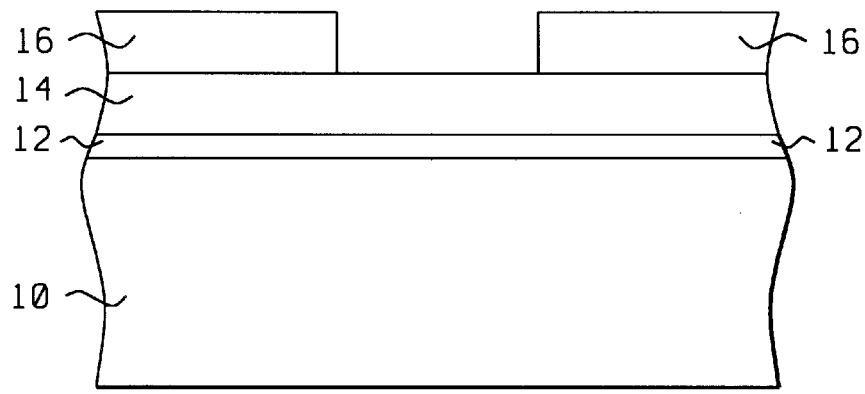
Figure 3:
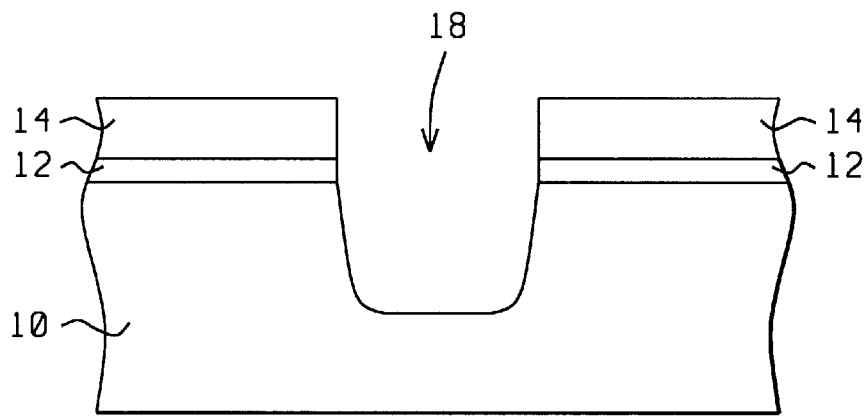

Referring to FIG. 2 a silicon monocrystalline wafer is depicted as the substrate 10 for the integrated circuit devices. A layer of silicon dioxide ($SiO_2$) 12 commonly known as pad oxide, is thermally grown on the substrate 10 to a thickness of between 10 and 30 nanometers (nm) by a process using a clean dry oxidizing ambient in a furnace between 750 and 850 degrees centigrade (°C.). A silicon nitride (SiN; $Si_3N_4$) layer (pad nitride) 14 between 150 and 250 nm thick is then deposited on the pad oxide layer 12 typically by low pressure chemical vapor deposition (LPCVD) with a temperature range of between 650 and 800° C.

An opening 18 is next patterned on the pad nitride 14 and pad oxide 12 layers by conventional photolithographic methods using photoresist 16 which are well known to those in the art, thereby forming a mask for the shallow trench. The silicon substrate under the mask is then anisotropically etched, typically with a reactive ion etch (RIE) process using etchant gasses containing chlorine ($Cl_2$,) or fluorine ($SF_6$) to a depth of between 250 and 450 nm.

The anisotropic RIE process creates essentially vertical walled trenches which is a desirable feature for increasing active circuit density. However, the sharp upper corners aggravate corner oxide coverage leading to potential stress related problems such as electric field crowding at the edge of the active device regions and poor gate oxide integrity.

Figure 4:
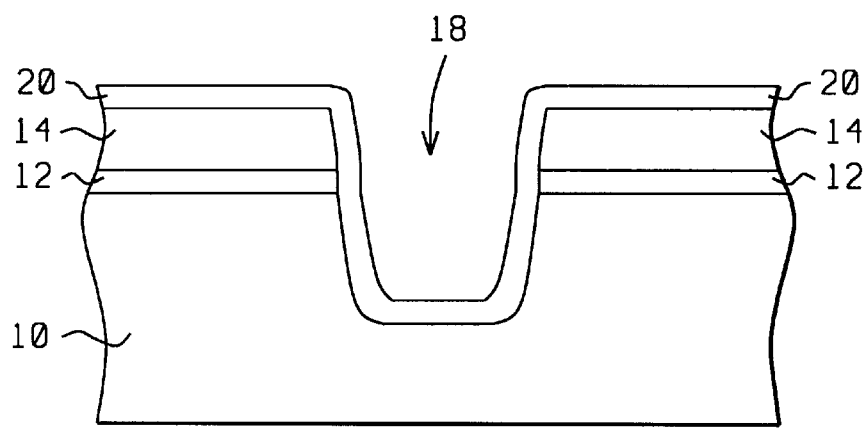

Referring to FIG. 4 a thin conformal layer of either crystalline or poly or amorphous silicon 20 is deposited over the structure covering the trench walls and bottom and covering the pad SiN 14 and pad oxide 12 where exposed to a thickness of between 10 and 60 nm. Usually the conformal silicon layer 20 is deposited by CVD using silicon tetrachloride ($SiCL_4$) or silane ($SiH_4$) as a source and at temperatures between 550 and 900° C. Depending on process parameters the silicon layer can be poly silicon, epitaxial silicon or amorphous silicon. When amorphous silicon is used, typically an implant step using silicon as a source specie at an energy level between 30 and 50 KeV is performed on the conformal silicon layer 20 to enhance crystalline silicon regrowth in the substrate region.

Referring to FIG. 5, the structure is shown after a thermal anneal step at a temperature of between 800 and 900° C. for a time period between 15 and 30 minutes. An optional alternative anneal process would be to use a rapid thermal process (RTP) anneal at temperatures between 1000 and 1100° C. for a time period between 20 and 80 seconds. This anneal step converts the conformal silicon layer 20 into epitaxial silicon 22 (dotted area) in the region where the layer was in contact with the silicon substrate in the open trench 18. The anneal process also converts the silicon on the vertical and horizontal surfaces of the silicon nitride 14 into a polysilicon structure 24. FIG. 6 shows the next step in the process. A layer of silicon oxide ($SiO_2$) 26 is grown on the epitaxial silicon 22 in the trench 18 and on the remaining conformal poly silicon layer 24. This layer is grown in a dry oxidizing ambient in a furnace between 850 and 950° C. to a thickness of between 10 and 30 nm. This oxide growth 26 reduces the polysilicon layer 24 thickness but does not entirely consume it, leaving a polysilicon layer 24 on the vertical and horizontal silicon nitride surfaces 14.

An overlay of $SiO_2$ 28 is next deposited, preferably by LPCVD, filling the trench opening 18. The trench oxide can be deposited by thermal decomposition of tetraethyl orthosilicate (TEOS) which is conformal. The deposition typically occurs at temperatures between 650 and 800° C. Another option to create the filler oxide 28 is to use silane ($SiH_4$) with nitrous oxide ($N_2O$) in an argon plasma.

The trench filler material may also consist of a substance other than silicon oxide, for example, a silicate glass. The deposition procedures for these various materials are well understood by those practicing the art.

As a process option, the filler oxide 28 can be densified by, using an ambient of wet oxygen or steam at a temperature of between 950 and 1050° C. for a period of 30 minutes.

After the optional densification process, the upper surface is subject to a planarization process, tropically chemical mechanical polishing (CMP). The CMP removes extraneous filler material and is continued just into the pad nitride layer 14. As an alternative to CMP, a reactive ion etch may be used. The remaining pad nitride 14 is then removed by either a wet etch in hot $H_3PO_4$ at a temperature between 100 and 200° C., or alternatively, a plasma etch may be used. With the plasma etch, the pad oxide 12 is used as an etch stop. As shown in FIG. 9, when the SiN 14 has been removed, a vertical layer of the conformal poly silicon 24 is left on the side of the fill oxide 28 in the area formerly covered by the SiN. This poly layer is key to the invention as it extends slightly into the device region as depicted in FIG. 9. After oxidation it will form the field oxide extensions over the corner regions.

The pad oxide may be removed at this time or left until after the next oxidation step. Typically the pad oxide is removed with a buffered oxide etch (BOE) usually containing dilute HF.

A final STI thermal oxidation is done which converts the vertical poly layer 24 into the field oxide extension 28A, as shown in FIG. 10. This is a thermal process carried out at temperatures between 850 and 950° C. for a period of between 3 and 5 minutes. This final SU silicon oxide layer is not suitable for active device usage, so an etch is performed to remove it in all active device areas except the field oxide extensions 28A. This is a calibrated etch typically performed with a wet BOE etch containing dilute HF. The field oxide extensions 28A, thermally grown from the polysilicon layer, have the property of more rapid growth during the formation stage, and a slower etching rate during the calibrated etch. This enables a suitable amount of the field oxide to remain over the device area forming the field oxide extensions. If the pad oxide is still present, it will be removed during the removal of the final STI oxide.

A unique characteristic to this invention is the oxide overlap structure resulting from the process embodied herein. As shown in FIG. 10 there is a definite oxide overlap from the STI which eliminates corner oxide voids, or thin coverage which can lead to device problems such as current crowding and possible reliability concerns. The extent of the overlap is between 5 and 20 nm which constitutes minimal, negligible consumption of active area, while at the same time assuring device isolation, operational characteristics and reliability.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a shallow trench isolation structure on a semiconductor substrate having field oxide regions extending over the edges of active device areas comprising:

forming a first oxide layer by thermal oxidation on said substrate;

depositing a silicon nitride (SiN) layer on said first oxide layer for a hard mask;

forming a trench in said substrate by patterning said substrate and etching said SiN hard mask, said first oxide layer and partially into said substrate;

forming a first conformal silicon layer over exposed surfaces of said substrate, said trench, said first oxide layer and said SiN hard mask;

annealing said conformal silicon layer to form epitaxial silicon in said trench substrate surface regions and polysilicon elsewhere;

forming a second oxide deposition layer on exposed surfaces of said trench epitaxial silicon and said polysilicon;

filling said trench opening with a third oxide deposition;

removing top surface of said trench fill third oxide deposition to just below top surface of said SiN hard mask layer;

removing said SiN hard mask layer and said first oxide layer by selective etching;

performing a fourth oxide deposition, covering surface of said trench fill third oxide deposition and said active device area;

removing said fourth oxide deposition layer leaving field oxide extensions over edge of said active device area near said trench corners;

continue processing of said active devices.

2. The method of claim 1 whereby said first oxide layer is pad oxide and is thermally grown at temperatures between 750 and 850° C. to a thickness of between 10 and 30 nm.

3. The method of claim 1 wherein said pad nitride hard mask is deposited by LPCVD at temperatures between 650 and 800° C. to a thickness between 150 and 250 nm.

4. The method of claim 1 wherein said trench is anisotropically etched by RIE using chlorine or fluorine as an etchant to a depth of between 250 and 450 nm.

5. The method of claim 1 wherein said first conformal silicon layer consists of amorphous silicon deposited by CVD using silicon tetrachloride or silane as source at temperatures between 550 and 900° C. to a thickness between 10 and 60 nm thick.

6. The method of claim 1 whereby said first conformal Si layer is annealed at a temperature between 800 and 900° C. for a time between 15 and 30 minutes.

7. The method of claim 1 whereby said first conformal Si layer is annealed using rapid thermal processing (RTP) at a temperature between 1000 and 1100° C. for a time between 20 and 80 seconds.

8. The method of claim 1 whereby said second oxide layer is thermally grown between 850 and 950° C. to a thickness between 10 and 30 nm.

9. The method of claim 1 whereby said trench fill oxide is deposited by LPCVD using silane as a source at temperatures between 650 and 800° C. to completely fill said trenches.

10. The method of claim 1 further comprising oxide densification using wet oxygen or steam at a temperature between 950 and 1050° C.

11. The method of claim 1 wherein said removal of said trench fill oxide top surface is done with chemical mechanical polishing (CMP) with a polishing rate ratio of silicon oxide to hard mask in a range of 3:1 to 4:1.

12. The method of claim 1 wherein said removal of said trench fill oxide top surface is done with an RIE plasma etch.

13. The method of claim 1 wherein the removal of said nitride hard mask is done using a wet etch using hot phosphoric acid or by a plasma dry etch using said pad oxide as a stop.

14. The method of claim 1 wherein said pad oxide is removed using a calibrated wet etch using BOE containing dilute hydrofluoric acid.

15. The method of claim 1 wherein said fourth STI oxide is thermally grown in an oxidizing environment at a temperature between 950 and 1050° C. for a time between 3 and 5 minutes.

16. The method of claim 1 wherein said fourth STI oxide is removed except for said extensions in said active device area using a calibrated wet etch using a BOE containing dilute hydrofluoric acid.

17. A method for fabricating a shallow trench isolation structure on a semiconductor substrate having field oxide regions extending over the edges of active device areas for improved oxide isolation capability comprising:

forming a first oxide layer by thermal oxidation on said substrate;

depositing a silicon nitride (SiN) layer on said first oxide layer for a hard mask;

forming a trench in said substrate by patterning said substrate and etching said SiN hard mask, said first oxide layer and partially into said substrate;

forming a first conformal polysilicon layer over exposed surfaces of said substrate trench, said first oxide layer and said SiN hard mask;

performing an implant on said conformal polysilicon layer;

annealing said conformal polysilicon layer to form epitaxial silicon in said trench substrate surface regions and polysilicon elsewhere;

forming a second oxide layer on exposed surfaces of said trench epitaxial silicon and said polysilicon;

filling said trench opening with a third oxide deposition;

removing top surface of said trench fill third oxide deposition to just below top surface of said SiN hard mask layer;

removing said SiN hard mask layer and said first oxide layer by selective etching;

performing a fourth oxide deposition, covering surface of said trench fill third oxide deposition and said active device area;

removing said fourth oxide deposition leaving field oxide extensions over edge of said active device area near said trench corners;

continue processing of said active devices.

18. The method of claim 17 whereby said pad oxide and is thermally grown at temperatures between 750 and 850° C. to a thickness of between 10 and 30 nm.

19. The method of claim 17 wherein said pad nitride hard mask is deposited by LPCVD at temperatures between 650 and 800° C. to a thickness between 150 and 250 nm.

20. The method of claim 17 wherein said trench is anisotropically etched by RIE using chlorine or fluorine as an etchant to a depth of between 250 and 450 nm.

21. The method of claim 17 wherein said first conformal polysilicon layer is deposited by CVD using silicon tetrachloride or silane as source at temperatures between 550 and 900° C. to a thickness between 10 and 60 nm thick.

22. The method of claim 17 whereby said conformal silicon layer is implanted with Si with an energy between 30 and 50 KeV.

23. The method of claim 17 whereby said first conformal Si layer is annealed at a temperature between 800 and 900° C. for a time between 15 and 30 minutes.

24. The method of claim 17 whereby said first conformal Si layer is annealed using rapid thermal processing (RTP) at a temperature between 1000 and 1100° C. for a time between 20 and 80 seconds.

25. The method of claim 17 wherein said second oxide layer is thermally grown between 850 and 950° C. to a thickness between 10 and 30 nm.

26. The method of claim 17 whereby said trench fill oxide is deposited by LPCVD using silane as a source at temperatures between 650 and 800° C. to completely fill said trenches.

27. The method of claim 17 further comprising oxide densification using wet oxygen or steam at a temperature between 950 and 1050° C.

28. The method of claim 17 wherein said removal of said trench fill oxide top surface is done with chemical mechanical polishing (CMP) with a polishing rate ratio of silicon oxide to hard mask in a range of 3:1 to 4:1.

29. The method of claim 17 wherein said removal of said trench fill oxide top surface is done with a RIE plasma etch.

30. The method of claim 17 wherein the removal of said nitride hard mask is done using a wet etch using hot phosphoric acid or by a plasma dry etch using said pad oxide as a stop.

31. The method of claim 17 wherein said pad oxide is removed using a calibrated wet etch using BOE containing dilute hydrofluoric acid.

32. The method of claim 17 wherein said fourth STI oxide is thermally grown in an oxidizing environment at a temperature between 950 and 1050° C. for a time between 3 and 5 minutes.

33. The method of claim 17 wherein said fourth STI oxide is removed except for said oxide extensions in said active device area using a calibrated wet etch using a BOE containing dilute hydrofluoric acid.

34. A method for fabricating a shallow trench isolation structure on a semiconductor substrate having field oxide regions extending over the edges of active device areas comprising:

forming a first oxide layer by thermal oxidation on said substrate;

depositing a silicon nitride (SiN) layer on said first oxide layer for a hard mask;

forming a trench in said substrate by patterning said substrate and etching said SiN hard mask, said first oxide layer and partially into said substrate;

forming a first conformal epitaxial silicon layer over exposed surfaces of said substrate trench, said first oxide and said SiN hard mask, and annealing said conformal epitaxial silicon layer to form polysilicon over said SiN hard mask surface regions;

forming a second oxide deposition layer on exposed surfaces of said trench epitaxial silicon and said polysilicon;

filling said trench opening with a third oxide deposition;

removing top surface of said trench fill third oxide deposition to just below top surface of said SiN hard mask layer;

removing said SiN hard mask layer;

performing a fourth oxide deposition, covering surface of said trench fill third oxide deposition and said active device area;

removing said fourth oxide deposition leaving field oxide extensions in active area near trench corners;

continue processing of said active devices.

35. The method of claim 34 whereby said pad oxide layer is pad oxide and is thermally grown at temperatures between 750 and 850° C. to a thickness of between 10 and 30 nm.

36. The method of claim 34 wherein said pad nitride hard mask is deposited by LPCVD at temperatures between 650 and 800° C. to a thickness between 150 and 250 nm.

37. The method of claim 34 wherein said trench is anisotropically etched by RIE using chlorine or fluorine as an etchant to a depth of between 250 and 450 nm.

38. The method of claim 34 wherein said fist conformal epitaxial layer is created using epitaxial reactors to a thickness between 10 and 60 nm thick.

39. The method of claim 34 whereby said second oxide layer is thermally grown between 850 and 950° C. to a thickness between 10 and 30 nm.

40. The method of claim 34 whereby said trench fill oxide is deposited by LPCVD using silane as a source at temperatures between 650 and 800° C. to completely fill said trenches.

41. The method of claim 34 whereby said trench fill oxide is deposited by high density low temperature (HDLTDP) plasma assisted deposition using TEOS or silane with nitrous oxide in an argon plasma.

42. The method of claim 34 wherein said removal of said trench fill oxide top surface is done with chemical mechanical polishing (CMP) with a polishing rate ratio of silicon oxide to hard mask in a range of 3:1 to 4:1.

43. The method of claim 34 wherein said removal of said trench fill oxide top surface is done with a RIE plasma etch.

44. The method of claim 34 wherein the removal of said nitride hard mask is done using a wet etch using hot phosphoric acid or by a plasma dry etch using said pad oxide as a stop.

45. The method of claim 34 wherein said fourth STI oxide is thermally grown in an oxidizing environment at a temperature between 950 and 1050° C. for a time between 3 and 5 minutes.

46. The method of claim 34 wherein said fourth STI oxide and said pad oxide are removed except for said oxide extensions in said active device area using a calibrated wet etch using a BOE containing dilute hydrofluoric acid in preparation for active device processing.

* * * * *

UNITED STATES PATENT AND TRADEMARK OFFICE
CERTIFICATE OF CORRECTION

PATENT NO. : 6,468,853 B1
DATED : October 22, 2002
INVENTOR(S) : Palanivel Balasubramanian et al.

It is certified that error appears in the above-identified patent and that said Letters Patent is hereby corrected as shown below:

<u>Title page,</u>
Item [73], add -- Institute of Microelectronics, Singapore (SG) --.

Signed and Sealed this

Twenty-seventh Day of May, 2003

JAMES E. ROGAN
*Director of the United States Patent and Trademark Office*